US010127809B2

(12) United States Patent
Macfarlane et al.

(10) Patent No.: US 10,127,809 B2
(45) Date of Patent: Nov. 13, 2018

(54) ADAPTIVE TRAFFIC DYNAMICS PREDICTION

(71) Applicant: HERE Global B.V., Eindhoven (NL)

(72) Inventors: Jane Macfarlane, Oakland, CA (US); Robert Grossman, River Forest, IL (US); Collin Bennett, River Forest, IL (US); James Pivarski, River Forest, IL (US)

(73) Assignee: HERE Global B.V., Eindhoven (NL)

( * ) Notice: Subject to any disclaimer, the term of this patent is extended or adjusted under 35 U.S.C. 154(b) by 0 days.

(21) Appl. No.: 15/845,197

(22) Filed: Dec. 18, 2017

(65) Prior Publication Data

US 2018/0108251 A1 Apr. 19, 2018

Related U.S. Application Data

(63) Continuation of application No. 15/361,744, filed on Nov. 28, 2016, now Pat. No. 9,875,652, which is a (Continued)

(51) Int. Cl.
*G08G 1/01* (2006.01)

(52) U.S. Cl.
CPC ........... *G08G 1/0129* (2013.01); *G08G 1/012* (2013.01); *G08G 1/0112* (2013.01); (Continued)

(58) Field of Classification Search
CPC ............... G08G 1/0112; G08G 1/0104; G08G 1/09685; G08G 1/0129; G08G 1/00; G08G 1/0133; G08G 1/0967; G08G 1/012; G08G 1/0116; G08G 1/0141; G01C 21/3469; G01C 21/32; G01C 21/3492; G06Q 10/04
USPC .......... 340/936, 906, 907, 995.13, 910, 917, 340/931; 701/201, 117–119, 202, 200, 701/204, 1
See application file for complete search history.

(56) References Cited

U.S. PATENT DOCUMENTS 7,706,964 B2 * 4/2010 Horvitz .............. G01C 21/3492 342/357.31
7,755,509 B2 * 7/2010 Bespalov ............. G08G 1/0104 340/905

(Continued)

OTHER PUBLICATIONS

Awasthi et al., Using Hybrid Clustering to Approximate Fastest Paths on Urban Networks, 2006.

(Continued)

*Primary Examiner* — Hoi Lau
(74) *Attorney, Agent, or Firm* — Lempia Summerfield Katz LLC

(57) ABSTRACT

The disclosed embodiments relate to prediction of traffic dynamics. A descriptive model is provided that uses historical probe data to create "tidal-like" patterns for the usual dynamics on the road network and creates a framework for taking a future time, e.g. in terms of month, day, time, and suggesting a typical speed for the specified road network link at that specific time. With this model, better predictions for estimated time of arrival will be derived. As opposed to blindly extrapolating from a static model, the disclosed embodiments dynamically adapt to current conditions using real time data to adapt, based on current conditions, the model from which a predicted speed may be determined.

21 Claims, 3 Drawing Sheets

Related U.S. Application Data continuation of application No. 14/176,361, filed on Feb. 10, 2014, now Pat. No. 9,536,424.

(52) U.S. Cl.
CPC ......... *G08G 1/0116* (2013.01); *G08G 1/0141* (2013.01); *H05K 999/99* (2013.01)

(56) References Cited

U.S. PATENT DOCUMENTS 8,041,660 B2 * 10/2011 Stehle .................... G06Q 10/04 706/14
8,437,948 B1 * 5/2013 Balasundaram ............................ G08G 1/096838 701/117
8,494,991 B2 * 7/2013 Stehle .................... G06Q 10/04 706/14
8,589,077 B2 * 11/2013 Obert ................. G08G 1/09685 701/117
9,129,522 B2 * 9/2015 Kwon .................. G08G 1/0112
9,171,461 B1 * 10/2015 Dabell ................. G08G 1/0137
9,536,424 B2 * 1/2017 Macfarlane .......... G08G 1/0129
9,875,652 B2 * 1/2018 Macfarlane .......... G08G 1/0129
2005/0021225 A1 * 1/2005 Kantarjiev ........... G08G 1/0112 701/527
2006/0089787 A1 * 4/2006 Burr ................... G01C 21/3469 701/533
2006/0158330 A1 * 7/2006 Gueziec ................ H04W 4/029 340/539.13
2007/0208494 A1 * 9/2007 Chapman ............. G08G 1/0104 701/117
2007/0208495 A1 * 9/2007 Chapman ............. G08G 1/0104 701/117
2007/0208496 A1 * 9/2007 Downs ................. G08G 1/0112 701/117
2007/0208498 A1 * 9/2007 Barker ................. G08G 1/0104 701/117
2007/0225894 A1 * 9/2007 Tsukamoto .......... G08G 1/0104 701/117
2007/0293958 A1 * 12/2007 Stehle .................... G06Q 10/04 700/30
2008/0004789 A1 * 1/2008 Horvitz .............. G01C 21/3492 701/117
2008/0033630 A1 * 2/2008 Lee ...................... G08G 1/0104 701/117
2009/0043486 A1 * 2/2009 Yang .................. G01C 21/3492 701/117
2009/0079586 A1 * 3/2009 Bespalov ............. G08G 1/0104 340/905
2010/0063715 A1 * 3/2010 Wynter ................ G08G 1/0104 701/118
2010/0076671 A1 * 3/2010 Pryakhin ................ G01C 21/32 701/119
2010/0217519 A1 * 8/2010 Englerth ............ G01C 21/3492 701/465
2010/0235077 A1 * 9/2010 Chan .................. G01C 21/3492 701/532
2011/0106416 A1 * 5/2011 Scofield ............... G08G 1/0104 701/119
2011/0153189 A1 * 6/2011 Chiang .............. G01C 21/3492 701/533
2011/0160987 A1 * 6/2011 Wu ...................... G08G 1/0104 701/117
2011/0160988 A1 * 6/2011 Rogers ................. G08G 1/0104 701/119
2011/0224893 A1 * 9/2011 Scofield ............. G01C 21/3492 701/119
2011/0307165 A1 * 12/2011 Hiestermann .......... G01C 21/32 701/119
2011/0320111 A1 * 12/2011 Sarma .................. G08G 1/0104 701/118
2012/0035839 A1 * 2/2012 Stehle .................... G06Q 10/04 701/117
2012/0065871 A1 * 3/2012 Deshpande .......... G08G 1/0112 701/118
2012/0221232 A1 * 8/2012 Shang .................. G08G 1/0104 701/119
2013/0282264 A1 * 10/2013 Bastiaensen ....... G01C 21/3492 701/119
2014/0032091 A1 * 1/2014 Arcot ................... G08G 1/0129 701/119
2014/0114556 A1 * 4/2014 Pan .......................... G08G 1/00 701/119
2015/0006068 A1 * 1/2015 Kwon .................. G08G 1/0112 701/119
2015/0073620 A1 * 3/2015 Matsumura ......... B60W 30/143 701/1
2015/0168157 A1 * 6/2015 Hoch ................. G01C 21/3469 701/400
2015/0168169 A1 * 6/2015 Caceres ............. G01C 21/3492 701/537
2015/0228188 A1 * 8/2015 Macfarlane .......... G08G 1/0129 340/936
2016/0275404 A1 * 9/2016 Abraham ............. G08G 1/0967
2016/0284212 A1 * 9/2016 Tatourian ............. G08G 1/0133
2017/0076595 A1 * 3/2017 Macfarlane .......... G08G 1/0129
2018/0108251 A1 * 4/2018 Macfarlane ............ G08G 1/012

OTHER PUBLICATIONS

Herrera et al., Incorporation of Lagrangian Measurements in Freeway Traffic State Estimation, Oct. 26, 2009, University of California.

* cited by examiner

ADAPTIVE TRAFFIC DYNAMICS PREDICTION

REFERENCE TO RELATED APPLICATIONS

This application is a continuation under 37 C.F.R. § 1.53(b) of U.S. patent application Ser. No. 15/361,744 filed Nov. 28, 2016, now U.S. patent Ser. No. 9,875,652, which is a continuation under 37 C.F.R. § 1.53(b) of U.S. patent application Ser. No. 14/176,361 filed Feb. 10, 2014 now U.S. Pat. No. 9,536,424, the entire disclosures of which is hereby incorporated by reference.

REFERENCE TO APPENDICES

The Appendices placed at the end of the specification and forming a part hereof show exemplary implementation details in accordance with the present teachings. These Appendices include:

Appendix A: Probe and Flow Model Integration: Probe Data Clustering Workflow;

Appendix B: Probe and Flow Model Integration: Descriptive Model;

Appendix C: Probe Data Clustering: Long-term Predictive Model;

Appendix D: Probe Data Clustering: Short-term Model and Real-time Scoring Engine;

Appendix E: A Method to Prepare Raw Probe Data for Traffic Analysis.

BACKGROUND

Navigation systems are available that provide end users with various navigation-related functions and features. For example, some navigation systems are able to determine an optimum route to travel along a road network from an origin location to a destination location in a geographic region. Using input from the end user, the navigation system can examine various potential routes between the origin and destination locations to determine the optimum route based on distance, travel time, road type, points of interest or other factors or combinations thereof. The navigation system may then provide the end user with information about the optimum route in the form of guidance that identifies the maneuvers required to be taken by the end user to travel from the origin to the destination location. Some navigation systems are able to show detailed maps on displays outlining the route, the types of maneuvers to be taken at various locations along the route, locations of certain types of features, and so on.

Some navigations systems may further provide real time traffic data/and or historical traffic data, such as via a map overlay showing such data in relation to the associated roads and/or by factoring such data into travel time or estimated arrival time calculations, e.g. via color codes, etc. Such data is typically provided by a Traffic company. Real time traffic data provides a snapshot of the current traffic conditions on the roads. Historical traffic data, also referred to as "traffic patterns," provides expected speeds for any given time and day, not taking into account the current conditions. One such Traffic company is Here Global B.V. which provide the Navteq Traffic Patterns™ service. Traffic pattern data may reflect a composite value, such as an average, of the speed measured over a period of time, accounting for various known recurring, cyclical or permanent conditions, e.g. variations in time of day, day of week etc. The result is a service which provides a representation of the expected speed of a road for a variety of conditions.

Predicted traffic speeds may be useful for users, for example, to estimate travel times more accurately for short term future trips. For example, the predictive traffic speed output will help users make decisions like when to start a trip to airport for a flight departing in the next couple of hours. This data may be utilized by navigation systems, governmental or regulatory agencies, news organizations, and/or other service providers to present users with accurate representations of expected road conditions and/or to compute accurate predicted travel times to a destination via various mediums such as a navigation system display, television, radio, SMS, electronic road sign, etc. In one application, a public or private bus system may predict and publish, such as via electronic signage located at bus stops or a mobile phone app, estimated arrival times of the busses which stop there at. Trucking companies may predict deliveries, adjust schedules or routes, estimate costs, etc.

Generally, historical traffic pattern ("TP") speed data is a composite of speed data measured over a period of time, and which may be partitioned based on previously known, recurring or permanent/fixed conditions such as time of day, day of week, scheduled occurrence of sporting or civic events, weather conditions, e.g. precipitation, no precipitation, etc., or combinations thereof, and may be further modeled or processed, such as statistically processed, normalized, etc., so as to provide an accurate estimate of the typical speed of a road at a given time and under a given occurrence of a recurring condition or event. It will be appreciated that modeling and/or statistical processing may be used to remove, or minimize, the effect of anomalous or outlier speed measurements which may skew the estimates. TP data may be centrally computed and accumulated and distributed, such as via a wireless network, on a subscription or other basis, such as via request or TP data for a particular road under particular conditions. Alternatively, or in addition thereto, TP data, or a portion thereof, such as for a given region, may be stored in medium, such as a volatile or non-volatile memory, e.g. an optical media, ROM or flash memory, and distributed to subscribers/purchasers to be used, for example, in conjunction with user's navigation system. Periodic updates to the TP data may then be distributed, via the same medium or via electronically distributed data updates, such as via a network.

Generally, real time RT data merely provides the current speed of the road measured or modeled at a particular time (or a composite, e.g. average, of measured values over a relatively short interval, e.g. five, ten, twenty or thirty minutes, etc.). As RT data is intended to represent the actual speed at the time of the measurement, the data may generally be provided in a substantially unprocessed form. For example, anomalous, temporarily aberrant and/or outlier RT speed measurements may or may not be retained, depending upon the implementation, so as to, for example, minimize their impact. RT data may be collected from the vehicle of the user using the disclosed embodiments, from other vehicles, e.g. probe vehicles, gps-enabled devices, e.g. smart phones, road sensors, traffic cameras, traffic reports, witnesses, etc. RT data may be centrally collected and distributed/broadcast, e.g. via a wireless network, to receivers/subscribers, such as mobile or portable navigation systems, news organizations, electronic road signs, etc. Alternatively, or in addition thereto, RT data may be collected by a mobile/portable navigation system or traffic reporting system for its own use. It will be appreciated that RT data collected by road sensors, probe vehicles, etc. may be distributed via wireless peer to peer or mesh based networks, e.g. the data is passed from a source and then from vehicle to vehicle, each navigation system within a vehicle being both a consumer of the data and a repeater thereof.

Existing traffic products use RT data (device id, latitude, longitude, speed, heading, sample time) from a variety of probe data sources (e.g. fleet vehicles and consumer devices) to create real-time depictions of traffic, e.g. to provide red-yellow-green status of road network segments based on the probe report for the road network segments. However, the penetration of probe data, i.e. the number of available and/or reliable data sources for a given road at a given time, varies geospatially and can be sparse. As a result, in the absence of real-time data, an algorithm must provide an estimate of the traffic dynamics.

Current approaches to building traffic models rely heavily on probe data sources. Rudimentary models for filling the estimate in the absence of data often are used. These rudimentary models may simply be fixed speed vs. time tables that are derived from historical data once a year. As such, these rudimentary models cannot accommodate changes in dynamics that are associated with common changes in traffic dynamics, such as holidays. Furthermore, these low level models for each segment operate independently and consequently cannot predict dynamics that are highly unlikely. For example, on a holiday these models will predict standard rush hour traffic when in fact the road network is in free flow.

DETAILED DESCRIPTION

Figure 1:
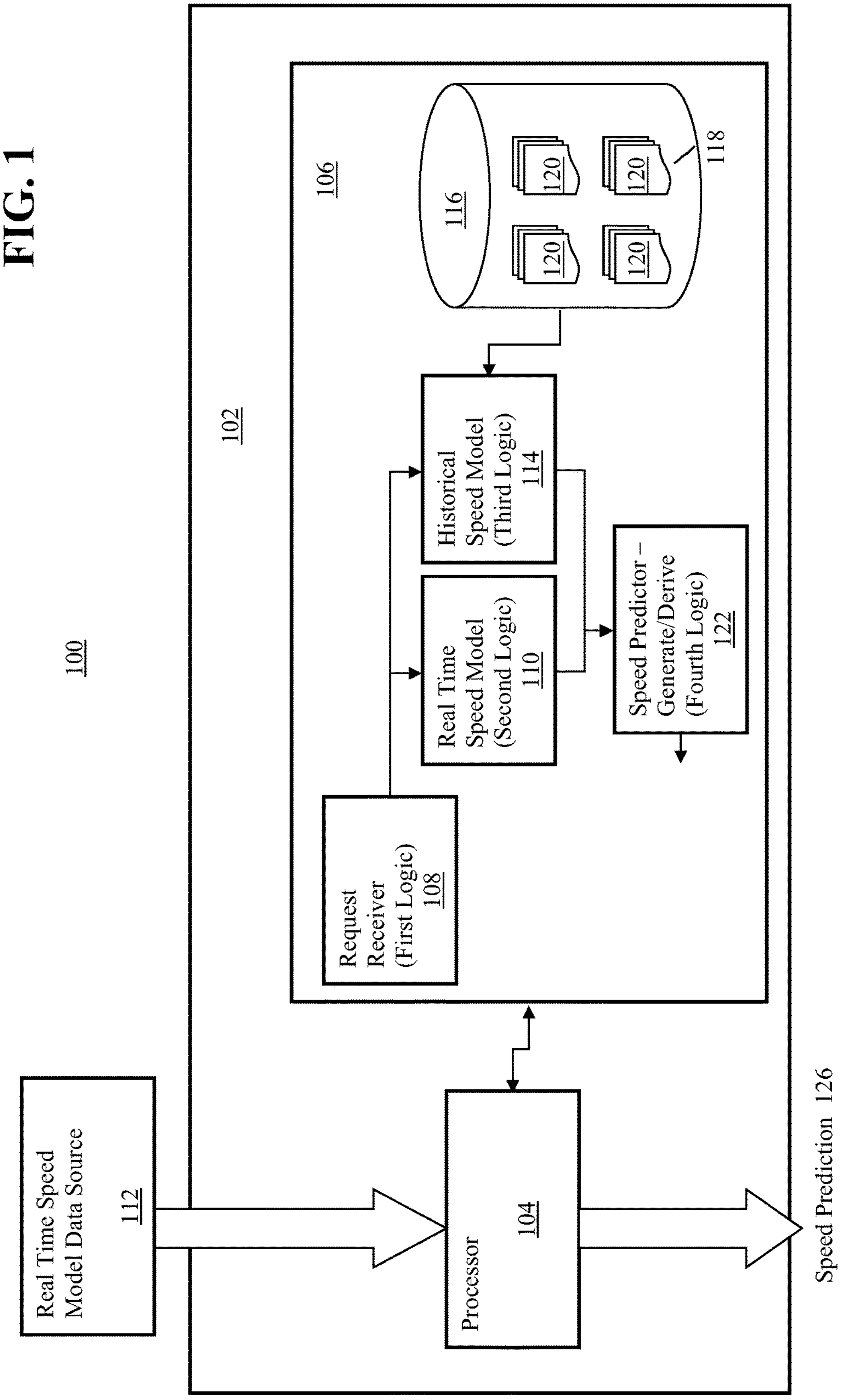
FIG. 1 is a block diagram of an exemplary implementation of a system for predicting traffic speeds according to one embodiment.

The disclosed embodiments relate to prediction of traffic dynamics. A descriptive model is provided that uses historical probe data to create "tidal-like" patterns for the usual dynamics on the road network and creates a framework for taking a future time, e.g. in terms of month, day, time, and suggesting a typical speed for the specified road network link at that specific time. With this model, better predictions for estimated time of arrival will be derived. As opposed to blindly extrapolating from a static model, the disclosed embodiments dynamically adapt to current conditions using real time data to adapt, based on current conditions, the model from which a predicted speed may be determined.

In one embodiment, historical speed profiles are built for the road network by clustering historical patterns into, for example, 2 day or 7 day models. These models may be built using k-means clustering, a method of vector quantization which aims to partition n observations into k clusters in which each observation belongs to the cluster with the nearest mean serving as a prototype of the cluster, for each individual road network segment and provide multiple representations for the traffic dynamics for each segment. This representation allows the algorithm for generating traffic dynamics estimate to context switch to a different model based on real-time probe data reports as will be described.

Descriptive models for traffic dynamics may be obtained from analyzing historical probe data and generating, for example, 2 or 7 day patterns for each individual road segment using a clustering algorithm. One example of such a process is described in Appendix E below. These models allow for the creation of wave like patterns describing the traffic dynamics for a period of time reflecting the normal ebb and flow of traffic. Multiple patterns may be associated with each road segment to accommodate for unique pattern variations that may occur/recur, such as special days and events in which the traffic dynamics are significantly different—e.g. weather events, holidays. Real-time probe information then informs the algorithm to pick a pattern that best conforms to the evidence from the probe data. This allows the descriptive model to change in real-time and as such will provide a significantly better estimate of travel times.

This approach to modeling traffic dynamics greatly improves the prediction of traffic by creating refined models for traffic dynamics in a variety of circumstances and adaptively switching among them based on real time data. It significantly improves the value of these types of products by creating a mechanism which may constantly learn from historic data. The improved views of current and future traffic dynamics can provide better estimates of travel time to the user but can also create a dynamic model that can be used to reroute the user should the estimated travel time not be acceptable. Further, the dynamics of the descriptive model may provide continuity throughout the network and smooth out the discontinuity that can result from algorithms that model each segment independently based on probe data.

In one embodiment, as will be described, speed profiles for road segments, based on historical observation, are combined based on the degree of adjacency of the road segments to each other and the similarity of the observed traffic patterns over time. That is, road segments expected to exhibit similar traffic behavior at or near the same time period due to their geographic proximity may be grouped together. The combined speed profiles for these road groupings are then analyzed to determine the most frequently recurring patterns of traffic behavior, such as by using a clustering algorithm as will be described. In one embodiment, up to 30 unique variations may be included, reflecting dynamics on, for example, rush hour periods, Monday mornings, Friday evenings, weekdays, weekend days, holidays, etc. When a speed prediction is desired for a particular road segment for a particular time, the appropriate profile grouping is identified. Recent and/or real time data for the given road segment, or grouping thereof, is then used in concert with the identified profile grouping to establish the predicted speed. For example, in one embodiment, the profiles in the grouping are combined using a weighted average wherein the recent/real-time data controls the weighting so adapt the weighted average to the current conditions being exhibited on the road. The weighted average, by emphasizing the most relevant profile over the others, is then used to estimate the traffic speed at the future time period. Alternatively, one profile of the group may be selected by comparing the profiles to the recent/real-time data to determine which profile best fits the current data. The selected profile may then be used to predict the traffic speed at the future time period.

For example:

Let G be a map of link segments, or more succinctly segments.

Let D denote a set of days. Generally, D are the 7 days in a week.

Let S denote a set of seasons. Generally, S are the 12 months of the year.

A profile may be thought of as a speed versus time graph for a fixed time interval. Typical time intervals are: 24 hours, 48 hours or 168 hours. Formally, a profile p may be defined as a function:

$$T \rightarrow V, \text{time} \mapsto \text{speed},$$

where time $T=[t_1,t_2]$ is a time interval and $V=[0,v_{max}]$ is a range of speeds. For the predictive models (tide and wave), time intervals T of seven days (168 hours) and 2 days (48 hours) may be used. Further, 12 hour historical profiles (the previous 12 hours) and 12 hour future profiles (the next 12 hours) may be used. For the historical model (also called the descriptive model), T is the time associated with the historical data.

The models below use a finite collection of profiles $P=\{p_1, p_2, \ldots, p_m\}$ constructed from historical probe data. Note that given a profile $p \in P$ and a time period T of k-hours, we can form a vector $(v_1, v_2, \ldots, v_k)$ where $v_i=p(i)$ is the speed at hour $i \in T$. We denote the length of this vector by $|T|$ (a slight abuse of notation).

Historical probe data is used to create a map $F_1: G \times T \rightarrow V$, (link,time) $\mapsto$ speed.

In the appendices, this is referred to as the descriptive model. It summarizes the probe data by link. We currently compute $F_1$ using LOESS regression. In one exemplary embodiment, how this model is built is described in Appendix B.

From historical probe data, a predictive model can be built of the form: $F_2: G \times D \times S \rightarrow P$, (link,day,season) $\mapsto$ profile. This is the long-term, averaged or tide model. It uses categorical or factors, such as day of the week, season etc.

A model of this form can be built using historical data as follows: Fix a time period T, say T equals 2 days, 7 days, etc. To compute $F_2$, the model $F_1$ is used to create a vector of length $|T|$ for each point in $G \times D \times S$ as described above. These vectors are then clustered using a clustering algorithm, such as k-means, and from these clusters, the map $F_2$ is created.

From historical probe data, and current recent/near real time probe data, a predictive model can be built of the form: $F_3: G \times D \times S \times P_{past} \rightarrow P$, (link, day, season, recent past profile) $\mapsto$ current future profile. This is the short-term, event based or wave model. It uses categorical or factors, such as day of the week, season etc., as well as recent or near real time profiles computed from current probe data. For example $P_{past}$ might be a probe-data based profile for the past 12 hours. It computes a profile for the future, say for the next 12 hours. It can also use categorical variables, such as the presence of an incident of a particular type, as an explanatory variable.

$F_3$ can be built, for example, by using hierarchical clustering and local spatial information from G to create profiles $P_0$. A model $F_3$ may then be computed by mapping to a larger space of profiles $P_1$ by averaging the closest k profiles from $P_0$. It will be appreciated that there may be other methods to construct $F_2$.

Referring now to the figures, FIG. 1 shows a block diagram of system 102 for generating a speed prediction according to one embodiment. It will be appreciated that the system 102 may be a component of a larger system 100, which may be mobile, vehicle based, remotely (wired and/or wirelessly) accessible or a combination thereof, such as a navigation system, traffic prediction system, navigational routing device, map generator, and the like, or combination thereof.

Herein, the phrase "coupled with" is defined to mean directly connected to or indirectly connected through one or more intermediate components. Such intermediate components may include both hardware and software based components. Further, to clarify the use in the pending claims and to hereby provide notice to the public, the phrases "at least one of <A>, <B>, . . . and <N>" or "at least one of <A>, <B>, . . . <N>, or combinations thereof" are defined by the Applicant in the broadest sense, superseding any other implied definitions herebefore or hereinafter unless expressly asserted by the Applicant to the contrary, to mean one or more elements selected from the group comprising A, B, . . . and N, that is to say, any combination of one or more of the elements A, B, . . . or N including any one element alone or in combination with one or more of the other elements which may also include, in combination, additional elements not listed.

The system 102 includes a request receiver 108, which may be implemented as separate component or as first logic 108, e.g. computer program logic, stored in a memory 106, or other non-transitory computer readable medium, and executable by a processor 104, such as the processor 302 and memory 304 described below with respect to FIG. 3, to cause the processor 104 to, or otherwise be operative to, receive a request for a predicted speed of travel for a portion of a road network, e.g. a specific location there or one or more links thereof, at a specified time period subsequent to the receipt of the request. It will be appreciated that the request may specify any future moment in time or time period, such as a moment in time within the next 12 hours, 1 day or 7 days. In one embodiment, the request may specify the time period as a calendar date, e.g. month, day, year and time of day. It will be appreciated that where the portion of the road network is but one portion of a route between a starting location and a destination comprising multiple portions where, as will be described, the system 102 may provide a prediction for each portion such that an overall prediction may be derived for the entire route, such as for total travel time applications, alternative route comparison applications, route recommendation applications, route optimization applications, etc. The specified time period for each prediction for a given portion may be adjusted either automatically or by the submitter of the request to account for the estimated time of arrival at that portion based on the predictions computed for the preceding portions to be navigated by the vehicle. As will be described, when performing the selection of profiles using recent speed data, this will automatically account for any propagation of changes in speeds as the appropriate profiles for the portion of the road network will be selected based on the estimated time that the vehicle is travelling that portion. As will be described, the provided speed prediction may apply to any location along the portion of the route but may be identified or otherwise denoted as applying to a specific location thereon.

While the request may specify a particular geographic location, a specific location along a road network, or one or more road links thereof, as described herein, the disclosed embodiments may provide speed estimates for portions of a road network wherein the portion of the road network may include one or more adjacent route links having one or more similar traffic patterns observed over one or more adjacent time periods. This grouping of route links, referred to as "bucketing," may result in a more condensed set of speed profiles, reducing the amount of data needed to be maintained, as well as a smoothing of predicted speed values over adjacent route links where the similarity of traffic behavior due to spatial and/or temporal adjacency negates or supersedes anomalous behavioral patterns or aberrations which may occur and cause individual predictions to diverge when unwarranted. As such, for example, the profiles of one route link for a given weekday may be combined with the profiles of another adjacent route link while the profiles of that same route link for a weekend day may be combined with yet another adjacent route link. The degree to which route links may be combined for analysis as described herein, based on degree of adjacency and/or degree of temporal pattern similarity, may be controlled by specifying the degree of similarity used for the combinatorial process to effectively control the degree of granularity for which speed predictions for individual route links may be provided. In practice, this may lead to surface streets being combined whereas highway links tend to remain separately treated however this is not guaranteed for a given network of roads. An exemplary process for grouping similar route links together is described in Appendices A and B.

The system 102 further includes a real time speed model 110, coupled with the request receiver 108, which may be implemented as a separate component or as second logic 110, e.g. computer program logic, stored in the memory 106, or other non-transitory computer readable medium, and executable by the processor 104, such as the processor 302 and memory 304 described below with respect to FIG. 3, to cause the processor 104 to, or otherwise be operative to, provide data indicative of recent and/or real-time or substantially proximate thereto, e.g. with respect to the time of receipt of the request, speed of travel along the portion of the road network 112. This data may be obtained from a database or data source, not shown, external to the system 102 or included as a component thereof. The data may be indicative of the speed of travel observed for a time period preceding the receipt of the request up to the moment thereof, such as the immediately preceding 12 hours. This data may further represent a constantly updated rolling window of time where, as time moves forward, the data is continuously updated with new observed values and the oldest observed values are discarded. The data may be in an incremental form, such as every 15 minutes, every hour, etc. and may be representative of either instantaneous observations at or during the increment or an average or other combination of observations made during the increment. The granularity of the data may be fixed or may vary, e.g. older data is less granular then more recent data. The data may be received or otherwise derived from data sources such as one or more probe vehicles, cellular telephones or other wireless devices carried by vehicle operators or passengers, speed sensors, witnesses or the like, or combinations thereof, or intermediate data sources which collect such data, such as governmental, media or commercial entities.

In one embodiment, the data indicative of the recent speed of travel along the portion of the road network is derived from one or more vehicles which have recently, e.g. within a 12 hour rolling window prior the receipt of the request, travelled at least part of the portion of the road network. If such data is unavailable, e.g. because the particular road portion is infrequently traveled, the most recent data for that road, which may be older than the desired window, or a derivation thereof, may be used.

The system 102 further includes a historical speed model 114, coupled with request receiver 108, which may be implemented as a separate component or as third logic 114, e.g. computer program logic, stored in the memory 106, or other non-transitory computer readable medium, and executable by the processor 104, such as the processor 302 and memory 304 described below with respect to FIG. 3, to cause the processor 104 to, or otherwise be operative to, access, based on the specified time period, a database 116, coupled therewith, including a plurality of speed profiles 118, i.e. speed vs. time patterns, curves, tables or models, which may be constructed by clustering similar patterns at similar times, e.g. all Monday mornings on non-holidays, the most frequently recurring observed traffic patterns. As described, each profile 118 includes data indicative of observed travel speeds along the portion of the road network during a prior time period, i.e. historically observed travel speeds for a variety of circumstances and/or variations. From the database 116, a subset 120 of the plurality of speed profiles 118 applicable to the specified time period is obtained, the subset comprising at least two speed profiles.

As described herein, the database 116, which may be referred to as a historical model, may be stored locally or remote from the system 102 and may store speed profiles for similar time periods each reflecting a variation in travel speeds which have occurred therein, each profile including/factoring in neighboring/adjacent link data for smoothing.

In particular, the specified time period of the request may include or be a portion of a future occurrence of a recurring time period, e.g. a particular day(s) of week/month, season, holiday, occasion, event or other periodic, cyclical, or recurring temporal period, such as a 24 hour, 48 hour/2 day period, 1 week/7 day period, etc. The time periods for which the profiles apply may be overlapping or non-overlapping. Accordingly, to account for the tidal, i.e. recurring ebb and flow, nature of traffic patterns, the subset 120 of the plurality of speed profiles 118 may include a speed profile, e.g. a speed vs. time curve/model for speed at any point along portion for any time within the time period, for each of a plurality, e.g. clusters, of frequently, i.e. unique/distinct (statistically, such as based on a clustering algorithm, or observationally) most populated or most often observed variations, recurring travel speed patterns observed during prior occurrences of the recurring time period, e.g. during prior occurrence of the same weekday, same holiday, etc. In one embodiments, the subsets 120 or clusters are created using a clustering algorithm such as k-means clustering where the number of clusters is defined to ensure that all of the most frequently occurring pattern variations may be included, e.g. 30 profiles per cluster. It will be appreciated that one of the profiles 118 may be the most frequently occurring pattern, i.e. the mean. The database 116 may be updated annually, biannually, quarterly or at other intervals including being updated on demand or in real time as new data is collected. A particular profile 118, or subset thereof, may apply to more than one road portion and/or to one or more time period. That is, similar or identical profiles may be combined or otherwise condensed to reduce the amount of data.

In one embodiment, clusters for a given portion of a road for a given time period may further include profiles of speed patterns observed during the occurrence of an aberration or incident such as weather, accident, sporting event. These profiles may be included by action of the clustering mechanism, e.g. because they frequently recur, or added in manually to aid in speed prediction. Such profiles may be identified within the subset 120 so as to be able to switch to that profile 118, as described below, when it is known that the associated incident or aberration is occurring or has recently occurred.

In one embodiment, the requested time period may be evaluated to determine which of the historical time periods in the database are most similar based on characteristics of the time period, the database 116 containing generally applicable profiles 118 for a variety of time periods.

The system 102 further includes a speed predictor 122, which may be referred to herein as a real time scoring engine, coupled with the historical speed model 114 and the real time speed model 110, which may be implemented as a separate component or as fourth logic 122, e.g. computer program logic, stored in the memory 106, or other computer readable medium, and executable by the processor 104, such as the processor 302 and memory 304 described below with respect to FIG. 3, to cause the processor 104 to, or otherwise be operative to, generate or otherwise derive, based on the data indicative of the recent speed of travel and the obtained subset 120 of the plurality of profiles 118, data indicative of the predicted speed of travel for the specified time period for the portion of the road network. In this manner, the rolling (constant updating) nature of the recent travel speed data results in a constant adaptation of the disclosed embodiments to real world changing conditions.

In one embodiment, the fourth logic 122 is further executable by the processor 108 to cause the processor 108 to compute a weighted average of the profiles 118 of the subset 120 of the plurality of profiles 120 weighted based on data indicative of the recent speed of travel.

Alternatively, or in addition thereto, in one embodiment, the fourth logic 122 is further executable by the processor 108 to cause the processor 108 to select the one profile of the subset 120 of the plurality of speed profiles 118 based on a best fit, e.g. a highest level of correlation, of the data indicative of recent speed of travel. While in one embodiment, the best fit, no matter how close, may be used, alternatively, the best fit that fits within a defined threshold/comparison/confidence level may be used. If more than one profile meets the criteria, the system 102 can take the first match or otherwise apply a random, pseudo random or round robin selection algorithm. In one embodiment, if no recent traffic data is available, the most populated (based on most sample data) profile of the subset may be selected.

Wherein the subset 120 of the plurality of profiles 118 includes one or more incident profiles, e.g. weather, accident, etc., the system 102 may further receive data indicative of the particular incident on the route link and select the incident profile associated with the particular incident, such as based on attribute data stored in association with the profile indicative thereof.

In one embodiment, the fourth logic 122 is further executable by the processor 108 to cause the processor 108 to generate, based on the subset 120 of the plurality of speed profiles 118, data indicative of the predicted travel speed for a time period subsequent to the receipt of the request, such as the next 12 hours, which includes the specified time period.

For example, the system 102 may operate continuously to generate forward predictions as new recent data is received until the current time equals the specified time period (or the specified time period has passed). Or the specified time period can be specified as the next 12 hours from the current time with the system 102 continuously operating as time moves forward.

Figure 2:
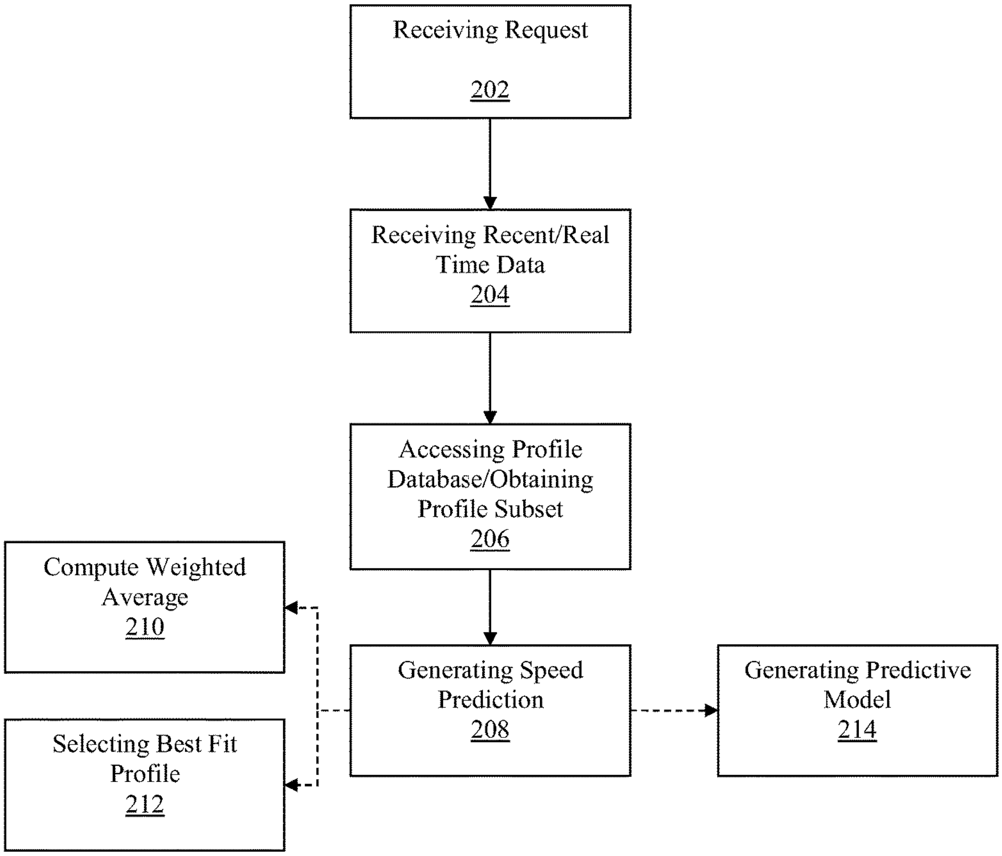
FIG. 2 depicts a flow chart showing operation of the system of FIG. 1.

FIG. 2 depicts a flow chart showing operation of the system 100 of FIG. 1. In particular FIG. 2 shows a computer implemented method including receiving, by a processor 104, a request for a predicted speed of travel for a portion of a road network, e.g. a specific location there or one or more links thereof, at a specified time period subsequent to the receipt of the request [block 202]. It will be appreciated that the request may specify any future moment in time or time period, such as a moment in time within the next 12 hours, 1 day or 7 days. In one embodiment, the request may specify the time period as a calendar date, e.g. month, day, year and time of day. It will be appreciated that where the portion of the road network is but one portion of a route between a starting location and a destination comprising multiple portions where, as will be described, the system 102 may provide a prediction for each portion such that an overall prediction may be derived for the entire route, s such as for total travel time applications, alternative route comparison applications, route recommendation applications, route optimization applications, etc. The specified time period for each prediction for a given portion may be adjusted either automatically or by the submitter of the request to account for the estimated time of arrival at that portion based on the predictions computed for the preceding portions to be navigated by the vehicle. As will be described, when performing the selection of profiles using recent speed data, this will automatically account for any propagation of changes in speeds as the appropriate profiles for the portion of the road network will be selected based on the estimated time that the vehicle is travelling that portion. As will be described, the provided speed prediction may apply to any location along the portion of the route but may be identified or otherwise denoted as applying to a specific location thereon.

While the request may specify a particular geographic location, a specific location along a road network, or one or more road links thereof, as described herein, the disclosed embodiments may provide speed estimates for portions of a road network wherein the portion of the road network may include one or more adjacent route links having one or more similar traffic patterns observed over one or more adjacent time periods. This grouping of route links, referred to as "bucketing," may result in a more condensed set of speed profiles, reducing the amount of data needed to be maintained, as well as a smoothing of predicted speed values over adjacent route links where the similarity of traffic behavior due to spatial and/or temporal adjacency negates or supersedes anomalous behavioral patterns or aberrations which may occur and cause individual predictions to diverge when unwarranted. As such, for example, the profiles of one route link for a given weekday may be combined with the profiles of another adjacent route link while the profiles of that same route link for a weekend day may be combined with yet another adjacent route link. The degree to which route links may be combined for analysis as described herein, based on degree of adjacency and/or degree of temporal pattern similarity, may be controlled by specifying the degree of similarity used for the combinatorial process to effectively control the degree of granularity for which speed predictions for individual route links may be provided. In practice, this may lead to surface streets being combined whereas highway links tend to remain separately treated however this is not guaranteed for a given network of roads. An exemplary process for grouping similar route links together is described in Appendices A and B.

The operation of the system 102 further includes receiving, by the processor 104, data indicative of recent and/or real time or substantially proximate thereto, e.g. with respect to the time or receipt of the request, speed of travel along the portion of the road network [block 204]. This data may be obtained from a database or data source, not shown, external to the system 102 or included as a component thereof. The data may be indicative of the speed of travel observed for a time period preceding the receipt of the request up to the moment thereof, such as the immediately preceding 12 hours. This data may further represent a constantly updated rolling window of time where, as time moves forward, the data is continuously updated with new observed values and the oldest observed values are discarded. The data may be in an incremental form, such as every 15 minutes, every hour, etc. and may be representative of either instantaneous observations at or during the increment or an average or other combination of observations made during the increment. The granularity of the data may be fixed or may vary, e.g. older data is less granular then more recent data. The data may be received or otherwise derived from data sources such as one or more probe vehicles, cellular telephones or other wireless devices carried by vehicle operators or passengers, speed sensors, witnesses or the like, or combinations thereof, or intermediate data sources which collect such data, such as governmental, media or commercial entities.

In one embodiment, the data indicative of the recent speed of travel along the portion of the road network is derived from one or more vehicles which have recently, e.g. within a 12 hour rolling window prior the receipt of the request, travelled at least part of the portion of the road network. If such data is unavailable, e.g. because the particular road portion is infrequently traveled, the most recent data for that road, which may be older than the desired window, or a derivation thereof, may be used.

The operation of the system 102 further includes accessing, by the processor 104 based on the specified time period, a database 116, stored in a memory 106, or other storage medium, coupled with the processor, including a plurality of speed profiles 118 i.e. speed vs. time patterns, curves, tables or models, which may be constructed by clustering similar patterns at similar times, e.g. all Monday mornings on non-holidays, the most frequently recurring observed traffic patterns. As described, each profile 118 includes data indicative of observed travel speeds along the portion of the road network during a prior time period, i.e. historically observed travel speeds for a variety of circumstances and/or variations. The operation of the system 102 then further includes obtaining therefrom a subset 120 of the plurality of speed profiles 118 applicable to the specified time period, the subset comprising at least two speed profiles 118 [block 206].

As described herein, the database 116, which may be referred to as a historical model, may be stored locally or remote from the system 102 and may store speed profiles for similar time periods each reflecting a variation in travel speeds which have occurred therein, each profile including/factoring in neighboring/adjacent link data for smoothing.

In particular, the specified time period of the request may include or be a portion of a future occurrence of a recurring time period, e.g. a particular day(s) of week/month, season, holiday, occasion, event or other periodic, cyclical, or recurring temporal period, such as a 24 hour, 48 hour/2 day period, 1 week/7 day period, etc. The time periods for which the profiles apply may be overlapping or non-overlapping. Accordingly, to account for the tidal, i.e. recurring ebb and flow, nature of traffic patterns, the subset 120 of the plurality of speed profiles 118 may include a speed profile, e.g. a speed vs. time curve/model for speed at any point along portion for any time within the time period, for each of a plurality, e.g. clusters, of frequently, i.e. unique/distinct (statistically, such as based on a clustering algorithm, or observationally) most populated or most often observed variations, recurring travel speed patterns observed during prior occurrences of the recurring time period, e.g. during prior occurrence of the same weekday, same holiday, etc. In one embodiments, the subsets 120 or clusters are created using a clustering algorithm such as k-means clustering where the number of clusters is defined to ensure that all of the most frequently occurring pattern variations may be included, e.g. 30 profiles per cluster. It will be appreciated that one of the profiles 118 may be the most frequently occurring pattern, i.e. the mean. The database 116 may be updated annually, biannually, quarterly or at other intervals including being updated on demand or in real time as new data is collected. A particular profile 118, or subset thereof, may apply to more than one road portion and/or to one or more time period. That is, similar or identical profiles may be combined or otherwise condensed to reduce the amount of data.

In one embodiment, clusters for a given portion of a road for a given time period may further include profiles of speed patterns observed during the occurrence of an aberration or incident such as weather, accident, sporting event. These profiles may be included by action of the clustering mechanism, e.g. because they frequently recur, or added in manually to aid in speed prediction. Such profiles may be identified within the subset 120 so as to be able to switch to that profile 118, as described below, when it is known that the associated incident or aberration is occurring or has recently occurred.

In one embodiment, the requested time period may be evaluated to determine which of the historical time periods in the database are most similar based on characteristics of the time period, the database 116 containing generally applicable profiles 118 for a variety of time periods.

The operation of the system 102 further includes generating or otherwise deriving, by the processor 104 based on the data indicative of the recent speed of travel and the obtained subset 120 of the plurality of profiles 118, data indicative of the predicted speed of travel for the specified time period for the portion of the road network [block 208]. In this manner, the rolling (constant updating) nature of the recent travel speed data results in a constant adaptation of the disclosed embodiments to real world changing conditions.

In one embodiment, the operation of the system 100 further includes computing a weighted average of the profiles 118 of the subset 120 of the plurality of profiles 118 weighted based on data indicative of the recent speed of travel [block 210].

Alternatively, or in addition thereto, in one embodiment, the operation of the system 100 further includes selecting the one profile 118 of the subset 120 of the plurality of speed profiles 118 based on a best fit, e.g. a highest level of correlation, of the data indicative of recent speed of travel [block 212]. While in one embodiment, the best fit, no matter how close, may be used, alternatively, the best fit that fits within a defined threshold/comparison/confidence level may be used. If more than one profile meets the criteria, the system 102 can take the first match or otherwise apply a random, pseudo random or round robin selection algorithm. In one embodiment, if no recent traffic data is available, the most populated (based on most sample data) profile of the subset may be selected.

Wherein the subset 120 of the plurality of profiles 118 includes one or more incident profiles, e.g. weather, accident, etc., the operation of the system 102 may further include receiving data indicative of a particular incident on the route link and selecting the incident profile associated with the particular incident—based on attribute data stored in association with the profile indicative thereof.

In one embodiment, the operation of the system 100 further includes generating, based on the selected profile 118, data indicative of the predicted travel speed for a time period subsequent to the receipt of the request, such as the next 12 hours, which includes the specified time period [block 214].

For example, the system 102 may operate continuously to generate forward predictions as new recent data is received until the current time equals the specified time period (or the specified time period has passed). Or the specified time period can be specified as the next 12 hours from the current time with the system 102 continuously operating as time moves forward.

An exemplary implementation of the disclosed embodiments is shown in Appendices A-E. It will be appreciated that there may be other ways to implement the disclosed embodiments and all such methods of implementation are contemplated herein.

Figure 3:
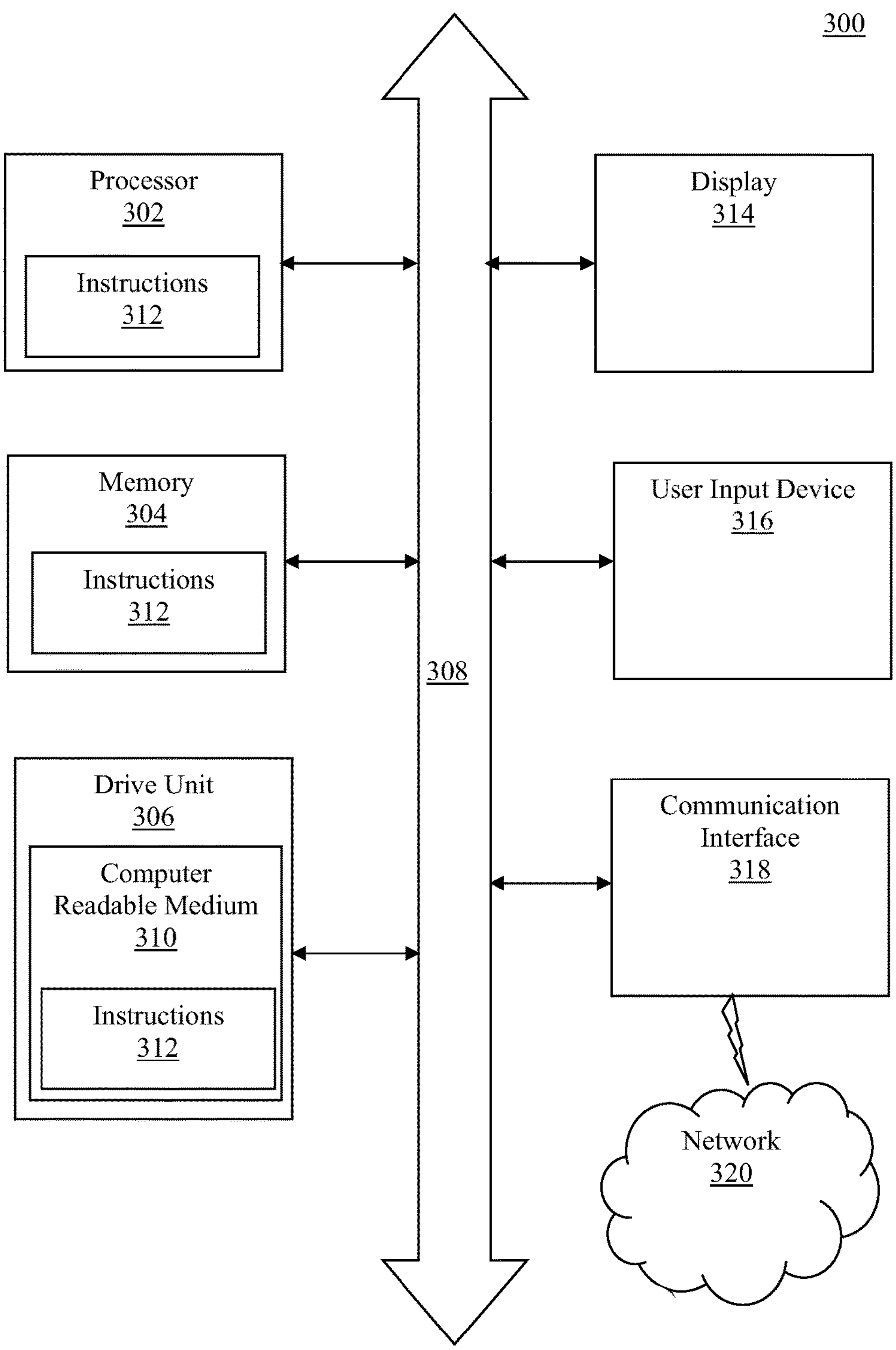
FIG. 3 shows an illustrative embodiment of a general computer system for use with the system of FIG. 1.

Referring to FIG. 3, an illustrative embodiment of a general computer system 300 is shown. The computer system 300 can include a set of instructions that can be executed to cause the computer system 300 to perform any one or more of the methods or computer based functions disclosed herein. The computer system 300 may operate as a standalone device or may be connected, e.g., using a network, to other computer systems or peripheral devices. Any of the components discussed above, such as the processor 108, may be a computer system 300 or a component in the computer system 300. The computer system 300 may implement a location based services system, of which the disclosed embodiments are a component thereof.

In a networked deployment, the computer system 300 may operate in the capacity of a server or as a client user computer in a client-server user network environment, or as a peer computer system in a peer-to-peer (or distributed) network environment. The computer system 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 300 can be implemented using electronic devices that provide voice, video or data communication. Further, while a single computer system 300 is illustrated, the term "system" shall also be taken to include any collection of systems or sub-systems that individually or jointly execute a set, or multiple sets, of instructions to perform one or more computer functions.

As illustrated in FIG. 3, the computer system 300 may include a processor 302, e.g., a central processing unit (CPU), a graphics processing unit (GPU), or both. The processor 302 may be a component in a variety of systems. For example, the processor 302 may be part of a standard personal computer or a workstation. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The computer system 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one embodiment, the memory 304 includes a cache or random access memory for the processor 302. In alternative embodiments, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the programmed processor 302 executing the instructions 312 stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the computer system 300 may further include a display unit 314, such as a liquid crystal display (LCD), an organic light emitting diode (OLED), a flat panel display, a solid state display, a cathode ray tube (CRT), a projector, a printer or other now known or later developed display device for outputting determined information. The display 314 may act as an interface for the user to see the functioning of the processor 302, or specifically as an interface with the software stored in the memory 304 or in the drive unit 306. A tactile output may further be provided such a mechanical or piezoelectric vibration motor.

Additionally, the computer system 300 may include an input device 316 configured to allow a user to interact with any of the components of system 300. The input device 316 may be a number pad, a keyboard, or a cursor control device, such as a mouse, or a joystick, touch screen display, remote control, accelerometer, motion sensor, proximity sensor, optional sensor, e.g. a camera, or any other device operative to interact with the system 300.

In a particular embodiment, as depicted in FIG. 3, the computer system 300 may also include a disk or optical drive unit 306. The disk drive unit 306 may include a computer-readable medium 310 in which one or more sets of instructions 312, e.g. software, can be embedded. Further, the instructions 312 may embody one or more of the methods or logic as described herein. In a particular embodiment, the instructions 312 may reside completely, or at least partially, within the memory 304 and/or within the processor 302 during execution by the computer system 300. The memory 304 and the processor 302 also may include computer-readable media as discussed above.

The present disclosure contemplates a computer-readable medium that includes instructions 312 or receives and executes instructions 312 responsive to a propagated signal, so that a device connected to a network 320 can communicate voice, video, audio, images or any other data over the network 320. Further, the instructions 312 may be transmitted or received over the network 320 via a communication interface 318. The communication interface 318 may be a part of the processor 302 or may be a separate component. The communication interface 318 may be created in software or may be a physical connection in hardware. The communication interface 318 is configured to connect with a network 320, external media, the display 314, or any other components in system 300, or combinations thereof. The connection with the network 320 may be a physical connection, such as a wired Ethernet connection or may be established wirelessly as discussed below. Likewise, the additional connections with other components of the system 300 may be physical connections or may be established wirelessly.

The network 320 may include wired networks, wireless networks, or combinations thereof. The wireless network may be a cellular telephone network, an 802.11, 802.16, 802.20, or WiMax network. Further, the network 320 may be a public network, such as the Internet, a private network, such as an intranet, or combinations thereof, and may utilize a variety of networking protocols now available or later developed including, but not limited to TCP/IP based networking protocols.

Embodiments of the subject matter and the functional operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a computer readable medium for execution by, or to control the operation of, data processing apparatus. While the computer-readable medium is shown to be a single non-transitory medium, the term "computer-readable medium" includes a single non-transitory medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein. The computer readable medium can be a machine-readable storage device, a machine-readable storage substrate, a memory device, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

As used in this application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is therefore intended that the foregoing detailed description be regarded as illustrative rather than limiting, and that it be understood that it is the following claims, including all equivalents, that are intended to define the spirit and scope of this invention.

What is claimed is:

1. A computer implemented method comprising:

storing, by a processor in a database stored in a memory coupled with the processor, data indicative of a historical model of traffic conditions of a road network, the historical model comprising a set of patterns indicative of traffic conditions that have occurred during a prior time period for different portions of the road network, wherein the set of patterns include subsets of at least two patterns for the same portion of the road network and the same portion of the prior time period, each of the at least two patterns of a subset defining different traffic conditions that have occurred on the portion of the road network at the portion of the prior time period;

predicting, by the processor based on the historical model, traffic conditions for at least a portion of the road network for a future time period, the predicting further comprising:

adapting, by the processor, the historical model, to account for current traffic conditions along at least the portion of the road network, the adapting comprising obtaining, by the processor, data indicative of real-time traffic conditions along at least the portion of the road network, identifying, by the processor based on the future time period, the subset of the at least two patterns for the particular portion of the road network applicable to the future time period, and selecting, by the processor, one of the at least two patterns of the identified subset based on the obtained data indicative of real-time traffic conditions, wherein different real-time traffic conditions result in selection of a different one of the at least two patterns of the identified subset.

2. The computer implemented method of claim 1 wherein the traffic conditions that have occurred on the portion of the road network at the portion of the prior time period comprise data indicative of observed travel speeds along the portion of the road network at the portion of the prior time period.

3. The computer implemented method of claim 1 wherein each subset comprises patterns indicative of the most frequently occurring traffic conditions along the portion of the road network at the portion of the prior time period.

4. The computer implemented method of claim 1 wherein the adapting further comprises calculating the future time period as an estimated arrival time at the portion of the road network based on a prior prediction of traffic conditions by the processor for another portion of the road network ahead of at least the portion of the road network.

5. The computer implemented method of claim 1 wherein the future time period comprises a calendar date and time of day.

6. The computer implemented method of claim 1 wherein at least the portion of the road network is at least part of a route between a starting location and a destination.

7. The computer implemented method of claim 1 wherein the obtained real-time traffic conditions are derived from one or more traffic data sources which have recently collected traffic data for at least the portion of the road network.

8. The computer implemented method of claim 1 wherein the future time period comprises a future occurrence of a recurring time period, each of the at least two patterns of each subset comprising a speed profile for each of a plurality of frequently recurring travel speed patterns observed during prior occurrences of the recurring time period.

9. The computer implemented method of claim 1 wherein the selecting further comprises computing a weighted average of the at least two patterns of the subset based on the obtained data indicative of real-time traffic conditions.

10. The computer implemented method of claim 1 wherein the selecting further comprises selecting the one of the at least two patterns of the identified subset based on a best fit of the obtained data indicative of real-time traffic conditions.

11. A system comprising:

a processor and a memory coupled therewith;

a database stored in the memory, the database comprising data indicative of a historical model of traffic conditions of a road network, the historical model comprising a set of patterns indicative of traffic conditions that have occurred during a prior time period for different portions of the road network, wherein the set of patterns include subsets of at least two patterns for the same portion of the road network and the same portion of the prior time period, each of the at least two patterns of a subset defining different traffic conditions that have occurred on the portion of the road network at the portion of the prior time period;

logic stored in the memory and executable by the processor to cause the processor to predict, based on the historical model, traffic conditions for at least a portion of the road network for a future time period, the logic being further executable by the processor to cause the processor to adapt the historical model to account for current traffic conditions along at least the portion of the road network via acquisition of data indicative of real-time traffic conditions along at least the portion of the road network, identification, based on the future time period, the subset of the at least two patterns for the particular portion of the road network applicable to the future time period, and selection of one of the at least two patterns of the identified subset based on the obtained data indicative of real-time traffic conditions, wherein different real-time traffic conditions result in selection of a different one of the at least two patterns of the identified subset.

12. The system of claim 11 wherein the traffic conditions that have occurred on the portion of the road network at the portion of the prior time period comprise data indicative of observed travel speeds along the portion of the road network at the portion of the prior time period.

13. The system of claim 11 wherein each subset comprises patterns indicative of the most frequently occurring traffic conditions along the portion of the road network at the portion of the prior time period.

14. The system of claim 11 wherein the logic is further executable by the processor to cause the processor to calculate the future time period as an estimated arrival time at the portion of the road network based on a prior prediction of traffic conditions by the processor for another portion of the road network ahead of at least the portion of the road network.

15. The system of claim 11 wherein the future time period comprises a calendar date and time of day.

16. The system of claim 11 wherein at least the portion of the road network is at least part of a route between a starting location and a destination.

17. The system of claim 11 wherein the obtained real-time traffic conditions are derived from one or more traffic data sources which have recently collected traffic data for at least the portion of the road network.

18. The system of claim 11 wherein the future time period comprises a future occurrence of a recurring time period, each of the at least two patterns of each subset comprising a speed profile for each of a plurality of frequently recurring travel speed patterns observed during prior occurrences of the recurring time period.

19. The system of claim 11 wherein the logic is further executable by the processor to cause the processor to compute a weighted average of the at least two patterns of the subset based on the obtained data indicative of real-time traffic conditions.

20. The system of claim 11 wherein t the logic is further executable by the processor to cause the processor to select the one of the at least two patterns of the identified subset based on a best fit of the obtained data indicative of real-time traffic conditions.

21. A system comprising:

a historical model of traffic conditions of a road network, the historical model comprising a set of patterns indicative of traffic conditions that have occurred during a prior time period for different portions of the road network, wherein the set of patterns include subsets of at least two patterns for the same portion of the road network and the same portion of the prior time period, each of the at least two patterns of a subset defining different traffic conditions that have occurred on the portion of the road network at the portion of the prior time period;

a traffic dynamics predictor coupled with the historical model and operative to predict, based on the historical model, traffic conditions for at least a portion of the road network for a future time period, the traffic dynamics predictor being further operative to adapt the historical model to account for current traffic conditions along at least the portion of the road network via acquisition of data indicative of real-time traffic conditions along at least the portion of the road network, identification, based on the future time period, the subset of the at least two patterns for the particular portion of the road network applicable to the future time period, and selection of one of the at least two patterns of the identified subset based on the obtained data indicative of real-time traffic conditions, wherein different real-time traffic conditions result in selection of a different one of the at least two patterns of the identified subset.

* * * * *